(12) United States Patent
Huang et al.

(10) Patent No.: US 6,507,119 B2
(45) Date of Patent: Jan. 14, 2003

(54) DIRECT-DOWNSET FLIP-CHIP PACKAGE ASSEMBLY AND METHOD OF FABRICATING THE SAME

(75) Inventors: Nan-Chun Huang, Taichung (TW); Yin-Jen Lin, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/726,746

(22) Filed: Nov. 30, 2000

(65) Prior Publication Data

US 2002/0063319 A1 May 30, 2002

(51) Int. Cl.[7] .......................... H01L 23/12; H01L 23/48; H01L 23/40; H01L 21/44; H01L 21/48; H01L 21/50
(52) U.S. Cl. ........................................ 257/778; 438/108
(58) Field of Search ................................. 257/737, 738, 257/773, 778; 438/108, 618, 619

(56) References Cited

U.S. PATENT DOCUMENTS 6,127,726 A * 10/2000 Bright et al. ............... 257/691

* cited by examiner

Primary Examiner—Tom Thomas
Assistant Examiner—Samuel Gebremariam
(74) Attorney, Agent, or Firm—Peter F. Corless; Steven M. Jensen; Edwards & Angell, LLP

(57) ABSTRACT

A new flip-chip technology, denominated as DDFC (Direct-Downset Flip-Chip) technology, is characterized by the forming of a downset device hole in the substrate, and by the use of an array of solder bumps over the semiconductor chip and an array of recessed solder-bump pads of an inwardly-tapered conical shape over the bottom surface of the device hole for bonding the semiconductor chip to the substrate. During assembly, the semiconductor chip is embedded in a direct-downset manner into the device hole of the substrate, with the solder bumps being fitted and wetted to the recessed solder-bump pads. The proposed DDFC technology can be implemented without requiring solder-deflux or flip-chip underfill processes, thereby simplifying overall package fabrication.

9 Claims, 3 Drawing Sheets

DIRECT-DOWNSET FLIP-CHIP PACKAGE ASSEMBLY AND METHOD OF FABRICATING THE SAME

BACKGROUND OF THE INVENTION

1. Field of the Invention

This invention relates to integrated circuit packaging technology, and more particularly, to a new flip-chip technology, denominated as DDFC (Direct-Downset Flip-Chip) technology, which can be used to fabricate a flip-chip package without the necessity of solder-deflux and flip-chip underfill steps.

2. Description of Related Art

Flip-chip technology is an advanced integrated circuit packaging technology, which is characterized by that the packaged semiconductor chip is mounted in an upside-down manner (i.e., flip chip) over a substrate and mechanically bonded and electrically coupled to the same by means of solder bumps. A typical flip-chip package assembly and method of fabricating the same is illustratively depicted in the following with reference to FIGS. 1A–1C and FIG. 2.

Referring first to FIG. 1A, this conventional flip-chip technology is used to pack a semiconductor chip 10 over a substrate 20 (note that FIGS. 1A–1C are simplified schematic diagrams to show only a small number of I/O pads and the parts related to the invention; the actual layout of the flip-chip package assembly may be much more complex; and some component sizes are enlarged for the purpose of easy understanding).

The semiconductor chip 10 has a circuit surface 10a (or called active surface, which is the surface where active circuit components and I/O pads are fabricated) and a noncircuit surface 10b (or called inactive surface, which is the surface where no active circuit components and I/O pads are fabricated). The circuit surface 10a of the semiconductor chip 10 is formed with an array of I/O pads 11, on which an array of solder bumps 30 are attached through a bumping process.

The substrate 20 has a front surface 20a and a back surface 20b, with the front surface 20a thereof being a flat plane and provided with an array of flatly-shaped solder-bump pads 21 arranged in correspondence to the array of solder bumps 30 over the circuit surface 10a of semiconductor chip 10. These solder-bump pads 21 which are each connected to one of a plurality of electrically-conductive traces (not shown) on the substrate 20.

As shown in FIG. 2, the conventional flip-chip packaging process with the semiconductor chip 10 and the substrate 20 includes the following five essential steps (S1) Die Bonding (D/B);

(S2) Solder Reflow;

(S3) Solder Deflux;

(S4) Flip-Chip Underfill; and (S5) Solder Ball (S/B).

Referring to FIG. 1B, in the die bonding step (step S1), the semiconductor chip 10 is mounted on the front surface 20a of the substrate 20, with the array of solder bumps 30 on the circuit surface 10a of the semiconductor chip 10 being aligned and attached respectively to the array of solder-bump pads 21 on the front surface 20a of the substrate 20.

As the semiconductor chip 10 is mounted in position over the substrate 20, a solder-reflow step (step S2) is performed to reflow the solder bumps 30 over the solder-bump pads 21, so as to cause the solder bumps 30 to be wetted to the solder-bump pads 21, thereby mechanically bonding and electrically coupling the semiconductor chip 10 to the substrate 20.

During the foregoing solder-reflow process, however, some solder fluxes would be left over other areas beyond the solder-bump pads 21. Therefore, in subsequence to the solder-reflow process, it is required to perform a solder-deflux step (step S3) so as to clean away the remanant solder fluxes over the substrate 20.

As the semiconductor chip 10 is bonded in position, however, a gap 12 would be undesirably left under the semiconductor chip 10 (i.e., between the semiconductor chip 10 and the substrate 20). Since the semiconductor chip 10 is different in coefficient of thermal expansion (CTE) from the substrate 20, if the gap 12 is not underfilled, it would easily cause the overall package construction to suffer from fatigue cracking and electrical failure due to thermal stress when undergoing high-temperature conditions.

Referring further to FIG. 1C, as a solution to the above-mentioned problem, it is required to perform a flip-chip underfill step (step S4) to fill an underfill material, such as epoxy resin, into the gap 12 shown in FIG. 1B to thereby form an underfill layer 13 between the semiconductor chip 10 and the substrate 20. The underfilled resin, when hardened, can serve as a mechanical reinforcement to the semiconductor chip 10 to cope against thermal stress.

Presently, a great variety of flip-chip underfill methods are available for the fabrication of the underfill layer 13. However, most of these flip-chip underfill methods are quite complex in procedural steps and thus laborious and time-consuming to implement.

Finally, a solder-ball implantation step (step S5) is performed to implant an array of solder balls 40 over the back surface 20b of the substrate 20, which are electrically connected to the electrically-conductive traces (not shown) connected to the solder-bump pads 21 to serve as external connecting means for the flip-chip packaged. This completes the flip-chip packaging process.

In practical implementation, however, the foregoing conventional flip-chip technology has the following drawbacks.

First, both the solder-deflux process (step S3) and the flip-chip underfill process (step S4) are quite laborious and time-consuming to implement, making the overall flip-chip packaging process quite cost-ineffective.

Second, since the solder-bump pads 21 are quite small in size, they provide only a small solder-wetting area for wetting to the solder bumps 30; and therefore, the wetting of the solder bumps 30 over the solder-bump pads 21 would be critical and thus likely to be unreliably realized, making the electrically coupling between the semiconductor chip 10 and the substrate 20 to be unreliable.

Third, it would be difficult to provide a heat sink to the packaged semiconductor chip 10; and therefore, the finished flip-chip package would be low in heat-dissipation efficiency.

Fourth, since the semiconductor chip 10 is mounted over the front surface 20a of the substrate 20, the finished flip-chip package is considerably large in height.

Fifth, since the solder bumps 30 are spaced at quite a small pitch and unisolated from each other during the solder-reflow process, they can easily come in touch with adjacent ones when being melted during the solder-reflow process, resulting in short-circuiting between adjacent solder bumps.

Sixth, since the joint area between the semiconductor chip 10 and the substrate 20 is small (i.e., the semiconductor chip 10 only has its circuit surface 10a joined to the substrate 20), it would easily cause structural damage by thermal stress due to the CTE mismatch between the semiconductor chip 10 and the substrate 20.

Related patents, include, for example, the U.S. Pat. No. 5,742,100 entitled "STRUCTURE HAVING FLIP-CHIP CONNECTED SUBSTRATES". This patented technology discloses an inventive method for the fabrication of a flip-chip package. By this patented technology, however, the above-mentioned drawbacks still exist.

SUMMARY OF THE INVENTION

It is therefore an objective of this invention to provide a new flip-chip technology, which can be used to fabricate a flip-chip package without the necessity of solder-deflux and flip-chip underfill step so as to make the overall packaging process more simplified in procedural steps.

It is another objective of this invention to provide a new flip-chip technology, which can provide a larger solder-wetting area to help allow more reliable electrically coupling between the semiconductor chip and the substrate.

It is still another objective of this invention to provide a new flip-chip technology, which can help allow the finished flip-chip package to have an increased heat-dissipation efficiency.

It is yet another objective of this invention to provide a new flip-chip technology, which can provide a smaller package size than the prior art.

It is still yet another objective of this invention to provide a new flip-chip technology, which can help prevent the problem of short-circuiting between adjacent solder bumps during solder-reflow process.

It is still yet another objective of this invention to provide a new flip-chip technology, which can help allow the minimization of structural damage by thermal stress due to CTE mismatch between the semiconductor chip and the substrate.

In accordance with the foregoing and other objectives, the invention proposes a new flip-chip technology denominated as DDFC (Direct-Downset Flip-Chip) technology.

The DDFC technology according to the invention provides a new flip-chip packaging process, which, broadly recited, comprises the following steps (1) preparing a semiconductor chip and a substrate; the semiconductor chip having a circuit surface and a noncircuit surface, with the circuit surface being formed with an array of I/O pads; and the substrate having a front surface and a back surface, with the front surface being formed with a downset device hole and a plurality of recessed solder-bump pads of a predefined shape over the bottom surface of the device hole; (2) providing a plurality of solder bumps respectively over the I/O pads of the semiconductor chip; (3) embedding the semiconductor chip into the device hole, with the solder bumps being respectively fitted into the recessed solder-bump pads over the bottom surface of the device hole; (4) performing a solder-reflow process to reflow the solder bumps over the recessed solder-bump pads; and (5) performing a solder-ball implantation process to implant an array of solder balls over the back surface of the substrate.

The DDFC technology according to the invention provides a new flip-chip package assembly, which, broadly recited, comprises the following components: (a) a semiconductor chip having a circuit surface and a noncircuit surface, with an array of I/O pads being formed over the circuit surface thereof; (b) a plurality of solder bumps, which are respectively attached to the I/O pads on the semiconductor chip; (c) a substrate having a front surface and a back surface, with the front surface being formed with a downset device hole and a plurality of recessed solder-bump pads of a predefined shape corresponding to the solder bumps on the semiconductor chip; (d) an array of solder balls implanted over the back surface of the substrate; and (e) a heat sink mounted over the device hole and in contact with the semiconductor chip; wherein the semiconductor chip is embedded in a direct-downset manner in the device hole of the substrate, with the solder bumps being fitted within and reflowed over the recessed solder-bump pads over the bottom surface of the device hole.

The foregoing DDFC technology according to the invention has the following advantages over the prior art: (1) allows the flip-chip packaging process to be implemented without the necessity of solder-deflux and flip-chip underfill steps; (2) allows more reliable electrically coupling between the flip-chip and the substrate; (3) allows an increased heat-dissipation efficiency to the flip-chip package; (4) allows the package size to be made smaller in height; (5) allows the prevention of short-circuiting between adjacent solder bumps during solder-reflow process; and (6) allows the minimization of structural damage by thermal stress due to CTE mismatch between the semiconductor chip and the substrate. Owing to these benefits, the flip-chip technology of the invention is more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The new flip-chip technology according to the invention is denominated as DDFC (Direct-Downset Flip-Chip) technology, which is disclosed in full details in the following with reference to FIGS. 3A–3C and FIG. 4.

Figure 3A:
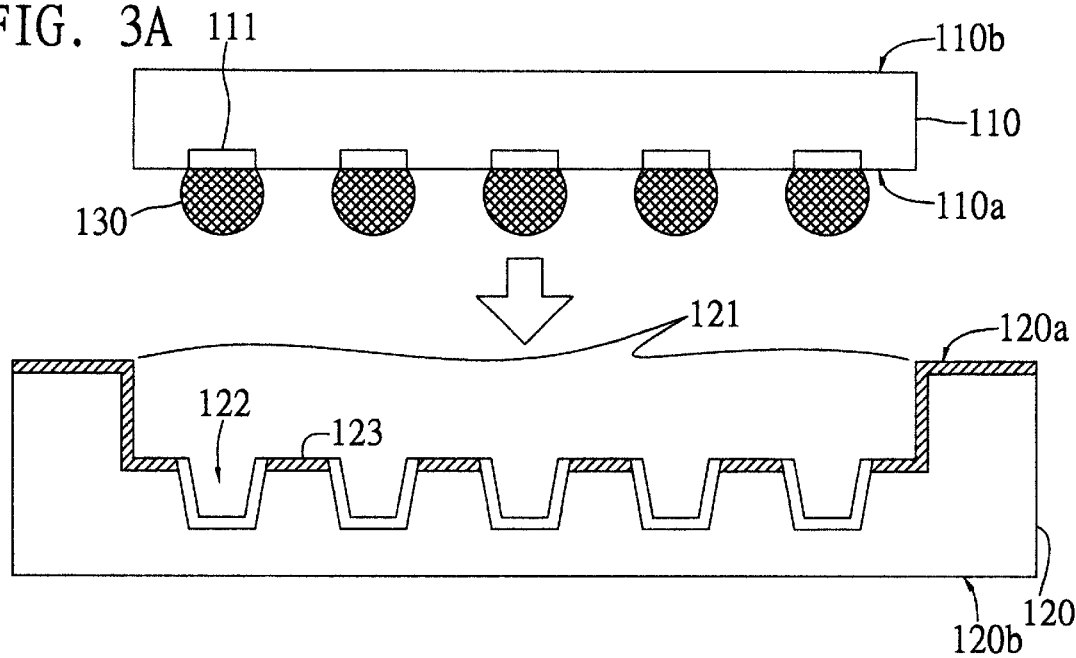
FIGS. 3A–3C are schematic sectional diagrams used to depict the procedural steps used for the fabrication of the flip-chip package according to the invention.
Figure 3B:
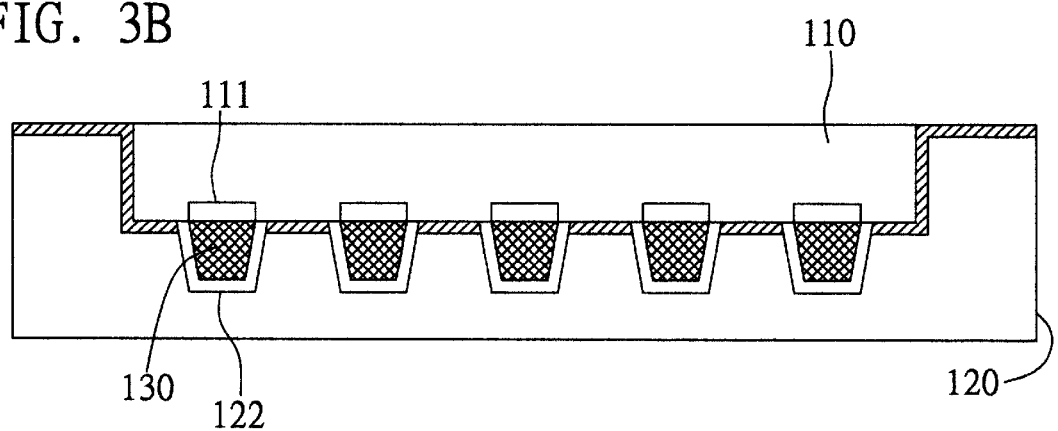
Figure 3C:
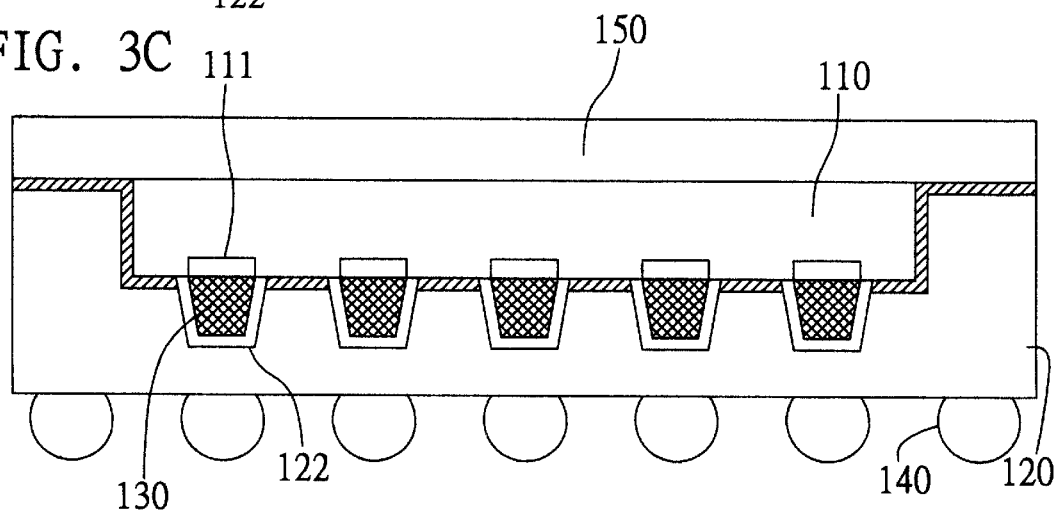

Referring first to FIG. 3A, in this embodiment, the DDFC technology according to the invention is used to pack a semiconductor chip 110 over a substrate 120 (note that FIGS. 3A–3C are simplified schematic diagrams to show only a small number of I/O pads and the parts related to the invention; the actual layout of the flip-chip package assembly may be much more complex; and some component sizes are enlarged for the purpose of easy understanding).

The semiconductor chip 110 has a circuit surface 110a (or called active surface, which is the surface where active circuit components and I/O pads are fabricated) and a noncircuit surface 110b (or called inactive surface, which is the surface where no active circuit components and I/O pads are fabricated). The circuit surface 110a of the semiconductor chip 110 includes an array of I/O pads 111, on which an array of solder bumps 130 are attached.

The substrate 120 can be, for example, a ceramic based substrate, but it can be various other type of substrate that is adapted for flip-chip application. In accordance with the invention, the substrate 120 is formed with a downset device hole 121 in the front surface 120a thereof and further formed with an array of recessed solder bump pads 122 and an electrically-insulative solder mask 123 over the bottom surface of the device hole 121. The device hole 121 is dimensioned in conformity with the semiconductor chip 110, so that it can allow the entirety of the semiconductor chip 110 to be snugly embedded therein. The recessed solder-bump pads 122 are dimensioned in conformity with the solder bumps 130 so that they can allow the solder bumps 130 to be snugly fitted therein. Further, the recessed solder-bump pads 122 are each electrically connected to one of a plurality of electrically-conductive traces (not shown) on the substrate 120.

Figure 1A:
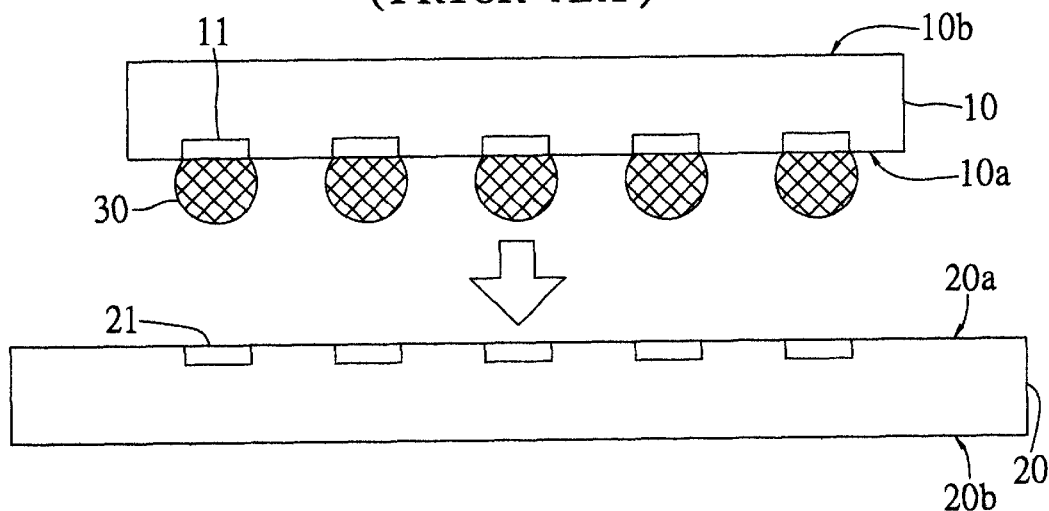
FIGS. 1A–1C (PRIOR ART) are schematic sectional diagrams used to depict the procedural steps used for the fabrication of a conventional flip-chip package assembly.
Figure 1B:
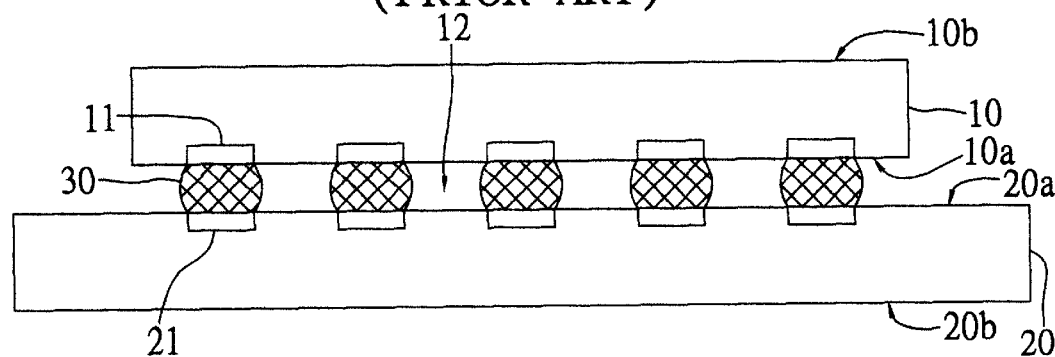
Figure 1C:
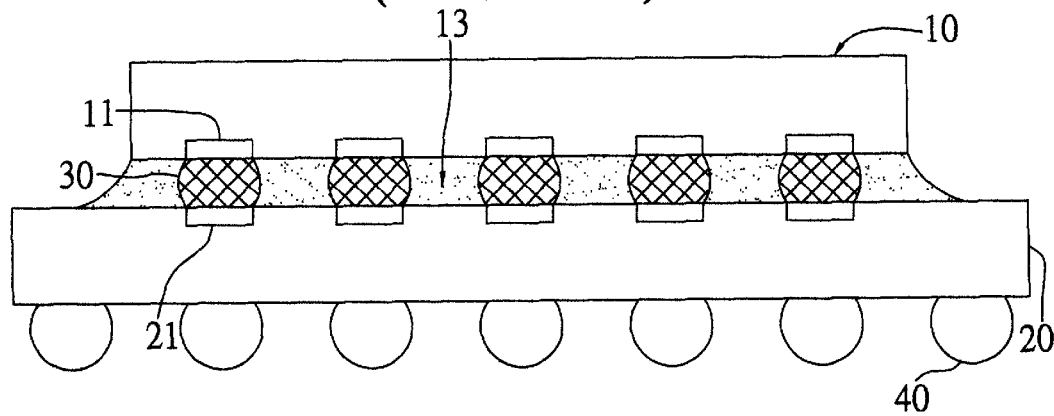
Figure 2:
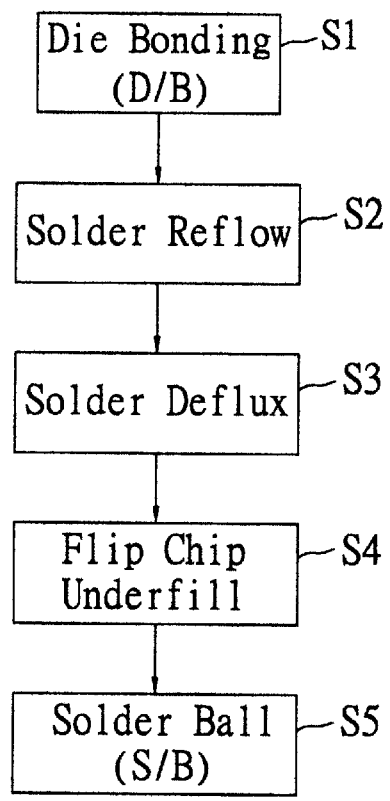
FIG. 2 (PRIOR ART) is a flow diagram showing the essential steps for the fabrication of the conventional flip-chip package assembly depicted in FIGS. 1A–1C.
Figure 4:
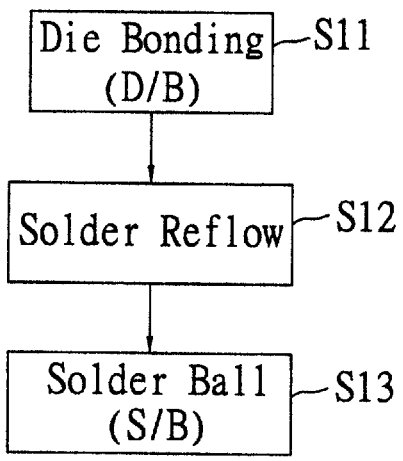
FIG. 4 is a flow diagram showing the essential steps for the fabrication of the flip-chip package according to the invention.

As shown in FIG. 4, the flip-chip packaging process with the semiconductor chip 110 and the substrate 120 according to the invention includes only the following three essential steps (rather than five essential steps shown in FIG. 2 for the prior art):

(S11) Die Bonding (D/B);
(S12) Solder Reflow; and
(S13) Solder Ball (S/B).

Referring to FIG. 3B, in the die-bonding step (step S11), the semiconductor chip 110 is embedded in a direct-downset manner into the device hole 121 of the substrate 120, with the circuit surface 110a thereof being tightly abutted over the bottom surface of the device hole 121, and with the solder bumps 130 being respectively fitted into the recessed solder-bumped pads 122 over the bottom surface of the device hole 121.

As the semiconductor chip 110 is embedded in position in the device hole 121, a solder-reflow step (step S12) is performed to reflow the solder bumps 130 over the recessed solder-bump pads 122 to cause the solder bumps 130 to be wetted to the recessed solder-bump pads 122, thereby mechanically bonding and electrically coupling the semiconductor chip 110 to the substrate 120.

During the foregoing solder-reflow step, since the solder bumps 130 are fitted and thereby confined within the recessed solder-bump pads 122, the reflowed solder bumps 130 would hardly flux to other areas beyond the recessed solder-bump pads 122 or come in touch with adjacent ones. Moreover, owing to the recessed substrate, the solder-bump pads 122 can provide a larger solder-wetting area to the solder bumps 130.

Referring further to FIG. 3C, in the next step, a solder-ball implantation step (step S13) is performed to implant an array of solder balls 140 over the back surface 120b of the substrate 120, which are electrically connected to the electrically-conductive traces (not shown) connected to the recessed solder-bump pads 122 to serve as external connecting means for the flip-chip package.

In addition, it is an optional step to mount a heat sink 150 over the front surface 120a of the substrate 120 and in contact with the noncircuit surface 110b of the packaged semi-conductor chip 110 for the purpose of providing a heat-dissipation path for the packaged semiconductor chip 110.

CONCLUSION

In conclusion, the invention provides a new flip-chip technology denominated as DDFC (Direct-Downset Flip-Chip) technology, which is characterized by the direct downset of the packaged semiconductor chip in the substrate.

Compared to the prior art, the flip-chip technology according to the invention has the following advantages.

First, since the solder bumps 130 are entirely confined within the recessed solder-bump pads 122, they would hardly flux to other areas beyond the recessed solder-bump pads 122; and therefore, no solder-deflux step is required. In addition, since the invention allows no gap to be left between the semiconductor chip 110 and the substrate 120, the flip-chip packaging process can be implemented without the necessity of flip-chip underfill. Therefore, compared to the prior-art, the flip-chip technology of the invention can be implemented without the necessity of solder-deflux and flip-chip underfill steps, making the overall flip-chip packaging process more simplified in procedural steps and thus most cost-effective to carry out than the prior art.

Second, since the recessed structure of the solder-bump pads 122 can provide a larger solder-wetting area than in the prior art, it allows the solder bumps 130 to be more reliably wetted to the recessed solder-bump pads 122, thereby providing more reliable electrically coupling between the semiconductor chip 110 and the substrate 120.

Third, since the invention allows a heat sink 150 to be firmly attached to the packaged semiconductor chip 110, the finished flip-chip package would have an increased heat-dissipation efficiency.

Fourth since the semiconductor chip 110 is embedded in a direct downset manner within the device hole 121 of the substrate 120 (rather than being mounted over the top surface of the substrate as the prior art), it allows the resulted package size to be smaller in height than the prior art.

Fifth, since the solder bumps 130 are fitted and thereby confined within the recessed solder-bump pads 122, they would hardly come in touch with adjacent ones during the solder-reflow process, thus preventing the problem of short-circuiting between the reflowed solder bumps 130.

Sixth, the direct-downset manner allows the sidewalls of the semiconductor chip 110 to be joined to the substrate 120 in addition to the circuit surface 110a thereof, so that it can help the minimization of structural damage by thermal stress due to CTE mismatch between the semiconductor chip 110 and the substrate 120.

Owing to the foregoing benefits, the flip-chip technology of the invention is undoubtedly more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a flip-chip package, comprising the steps of:

(1) preparing a semiconductor chip and a substrate;
   the semiconductor chip having a circuit surface and a noncircuit surface, with the circuit surface being formed with an array of I/O pads; and
   the substrate having a front surface and a back surface, with the front surface being formed with a downset device hole corresponding in dimension to the semiconductor chip and a plurality of recessed solder-bump pads of a predefined shape over a bottom surface of the service hole;

(2) providing a plurality of solder bumps respectively over the I/O pads of the semiconductor chip;

(3) embedding the semiconductor chip into the downset device hole of the substrate, wherein the semiconductor chip is engaged with the device hole in a manner that the circuit surface of the semiconductor chip abuts against the bottom surface of the device hole, and the solder bumps are respectively fitted into the recessed solder-bump pads over the bottom surface of the device hole, without forming any gap between the semiconductor chip and the substrate;

(4) performing a solder-reflow process to reflow the solder bumps over the recessed solder-bump pads; and (5) performing a solder-ball implantation process to implant an array of solder balls over the back surface of the substrate.

2. The method of claim 1, further comprising the step of:

(6) attaching a heat sink over the device hole and in contact with the non-circuit surface of the semiconductor chip.

3. The method of claim 1, wherein in said step (1), the substrate is a ceramic based substrate.

4. The method of claim 1, wherein in said step (1), the predefined shape of the recessed solder-bump pads is an inwardly-tapered conic shape.

5. A method for fabricating a flip-chip package, comprising the steps of:

(1) preparing a semiconductor chip and a substrate;
   the semiconductor chip having a circuit surface and a noncircuit surface, with the circuit surface being formed with an array of I/O pads; and
   the substrate having a front surface and a back surface, with the front surface being formed with a downset device hole corresponding in dimension to the semiconductor chip and a plurality of recessed solder-bump pads of an inwardly-tapered conic shape over a bottom surface of the device hole;

(2) providing a plurality of solder bumps respectively over the I/O pads of the semiconductor chip;

(3) embedding the semiconductor chip into the downset device hole of the substrate, wherein the semiconductor chip is engaged with the device hole in a manner that the circuit surface of the semiconductor chip abuts against the bottom surface of the device hole, and the solder bumps are respectively fitted into the recessed solder-bump pads over the bottom surface of the device hole, without forming any gap between the semiconductor chip and the substrate;

(4) performing a solder-reflow process to reflow the solder bumps over the recessed solder-bump pads;

(5) performing a solder-ball implantation process to implant an array of solder balls over the back surface of the substrate; and (6) attaching a heat sink over the device hole and in contact with the non-circuit surface of the semiconductor chip.

6. The method of claim 5, wherein the substrate is a ceramic based substrate.

7. A flip-chip package assembly, which comprises:

(a) a semiconductor chip having a circuit surface and a noncircuit surface, with an array of I/O pads being formed over the circuit surface thereof;

(b) a plurality of solder bumps which are respectively attached to the I/O pads on the semiconductor chip;

(c) a substrate having a front surface and a back surface, with the front surface being formed with a downset device hole corresponding in dimension to the semiconductor chip and a plurality of recessed solder-bump pads of a predefined shape corresponding to the solder bumps on the semiconductor chip;

wherein the semiconductor chip is embedded in a direct-downset manner in the device hole of the substrate, with the semiconductor chip being engaged with the device hole in a manner that the circuit surface of the semiconductor chip abuts against the bottom surface of the device hole, and the solder bumps being fitted within and reflowed over the recessed solder bump pads over the bottom surface of the device hole, without forming any gap between the bump pads over the bottom surface of the device hole, without forming any gap between the semiconductor chip and the substrate;

the flip-chip package assembly further comprising:

(d) an array of solder balls implanted over the back surface of the substrate; and (e) a heat sink mounted over the device hole and in contact with the noncircuit surface of the semiconductor chip.

8. The flip-chip package assembly of claim 7, wherein the substrate is a ceramic based substrate.

9. The flip-chip package assembly of claim 7, wherein the predefined shape of the recessed solder-bump pads is an inwardly-tapered conic shape.

\* \* \* \* \*